United States Patent
Yilmaz et al.

(10) Patent No.: US 10,044,353 B2
(45) Date of Patent: Aug. 7, 2018

(54) SUBSTANTIALLY EDGELESS TOUCH SENSOR

(75) Inventors: Esat Yilmaz, Santa Cruz, CA (US);
Jalil Shaikh, Fremont, CA (US)

(73) Assignee: Atmel Corporation, Chandler, AZ (US)

( * ) Notice: Subject to any disclaimer, the term of this patent is extended or adjusted under 35 U.S.C. 154(b) by 497 days.

(21) Appl. No.: 13/206,689

(22) Filed: Aug. 10, 2011

(65) Prior Publication Data

US 2013/0038563 A1 Feb. 14, 2013

(51) Int. Cl.
*G06F 3/041* (2006.01)
*H03K 17/96* (2006.01)
*G06F 3/044* (2006.01)

(52) U.S. Cl.
CPC ......... *H03K 17/9622* (2013.01); *G06F 3/041* (2013.01); *G06F 3/044* (2013.01); *H03K 2217/96031* (2013.01); *H03K 2217/960755* (2013.01)

(58) Field of Classification Search
CPC ............... G06F 3/041; G06F 3/0412; G06F 2203/04102; G06F 3/044; G06F 3/0416; G06F 3/0202; G06F 1/1626; G06F 2203/04103
USPC ................ 345/173–178; 178/18.01–18.06
See application file for complete search history.

(56) References Cited

U.S. PATENT DOCUMENTS

| | | | |
|---|---|---|---|
| 7,663,607 B2 | 2/2010 | Hotelling | |
| 7,808,255 B2 * | 10/2010 | Hristov et al. | ................ 324/686 |
| 7,875,814 B2 | 1/2011 | Chen | |
| 7,884,808 B2 * | 2/2011 | Joo | ............... 345/173 |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,368,654 B2 * | 2/2013 | Rosenblatt et al. | .......... 345/173 |
| 8,416,208 B2 * | 4/2013 | Kim et al. | ............. 345/173 |
| 8,484,838 B2 * | 7/2013 | Badaye | ............ G06F 3/044 29/622 |
| 2004/0239650 A1 * | 12/2004 | Mackey | ........................ 345/174 |
| 2005/0280003 A1 | 12/2005 | Watanabe | |
| 2008/0007539 A1 * | 1/2008 | Hotelling | ....................... 345/173 |
| 2008/0246496 A1 * | 10/2008 | Hristov et al. | ............... 324/686 |
| 2009/0194344 A1 * | 8/2009 | Harley | .................... G06F 3/044 178/18.06 |

(Continued)

FOREIGN PATENT DOCUMENTS

| | | |
|---|---|---|
| CN | 201600836 | 10/2010 |
| CN | 102073406 A | 5/2011 |
| WO | WO 2012/129247 | 9/2012 |

OTHER PUBLICATIONS

U.S. Appl. No. 61/454,936, filed Mar. 21, 2011, Myers.

(Continued)

*Primary Examiner* — Jason Mandeville
(74) *Attorney, Agent, or Firm* — Baker Botts L.L.P.

(57) ABSTRACT

In one embodiment, an apparatus includes a substrate configured to extend substantially out to at least two edges of a surface of a device. The apparatus also includes a touch sensor disposed on the substrate, the touch sensor comprising an active area that is configured to extend substantially out to at least two of the edges of the surface of the device.

22 Claims, 3 Drawing Sheets

(56) References Cited

U.S. PATENT DOCUMENTS

| | | |
|---|---|---|
| 2009/0315854 A1 | 12/2009 | Matsuo |
| 2010/0045618 A1* | 2/2010 | Huang .......................... 345/173 |
| 2010/0090979 A1* | 4/2010 | Bae ........................ G06F 3/044 |
| | | 345/174 |
| 2010/0149108 A1* | 6/2010 | Hotelling et al. ............ 345/173 |
| 2011/0254780 A1* | 10/2011 | Kim et al. .................. 345/173 |
| 2012/0162099 A1* | 6/2012 | Yoo et al. .................... 345/173 |
| 2012/0218219 A1* | 8/2012 | Rappoport .......... H01L 27/3276 |
| | | 345/174 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2012/0255167 A1* | 10/2012 | Badaye .................. G06F 3/044 |
| | | 29/846 |
| 2013/0076612 A1 | 3/2013 | Myers |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
U.S. Appl. No. 13/198,579, filed Aug. 4, 2011, Yilmaz.
CN 12876 Office Action and Search Report and translation of Search Report, dated Apr. 12, 2016.

\* cited by examiner

SUBSTANTIALLY EDGELESS TOUCH SENSOR

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive display application, the touch sensor may enable a user to interact directly with what is displayed on the screen, rather than indirectly with a mouse or touchpad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are different types of touch sensors, such as (for example) resistive touch screens, surface acoustic wave touch screens, and capacitive touch screens. Herein, reference to a touch sensor may encompass a touch screen, and vice versa, where appropriate. A capacitive touch screen may include an insulator coated with a substantially transparent conductor in a particular pattern. When an object touches or comes within proximity of the surface of the capacitive touch screen, a change in capacitance may occur within the touch screen at the location of the touch or proximity. A controller may process the change in capacitance to determine its position on the touch screen.

DESCRIPTION OF EXAMPLE EMBODIMENTS

Figure 1:
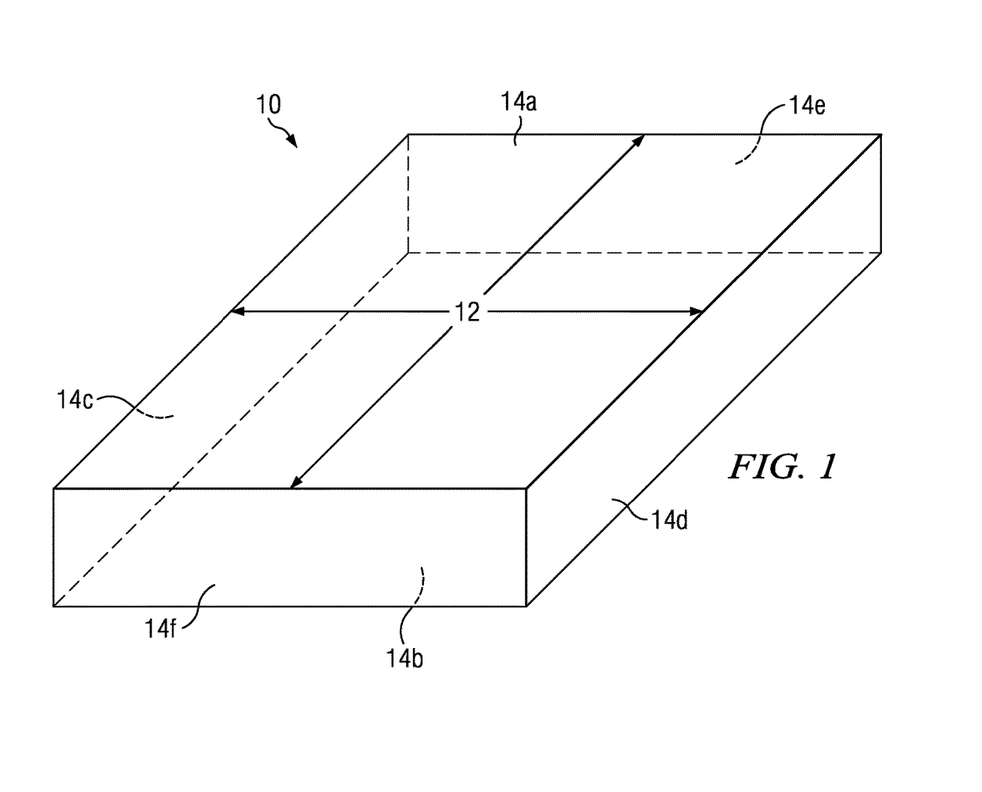
FIG. 1 illustrates an example device with an example substantially edgeless touch-sensitive area.

FIG. 1 illustrates an example device 10 with an example substantially edgeless touch-sensitive area 12. Device 10 may be a smartphone, a PDA, a tablet computer, a laptop computer, a desktop computer, a kiosk computer, a satellite navigation device, a portable media player, a portable game console, a point-of-sale device, another suitable device 10, a suitable combination of two or more of these, or a suitable portion of one or more of these. Device 10 may have six surfaces 14: (1) front surface 14a; (2) back surface 14b; (3) left-side surface 14c; (4) right-side surface 14d; (5) top surface 14e; and (6) bottom surface 14f. Although this disclosure describes and illustrates a particular device with a particular number of particular surfaces with particular shapes and sizes, this disclosure contemplates any suitable device with any suitable number of any suitable surfaces with any suitable shapes (including but not limited to being planar in whole or in part, curved in whole or in part, flexible in whole or in part, or a suitable combination of these) and any suitable sizes.

Device 10 may have a touch-sensitive area 12 on front surface 14a. Touch-sensitive area 12 may detect the presence and location of a touch or the proximity of an object (for example a user's finger or a stylus) within touch-sensitive area 12. Touch-sensitive area 12 may extend out to one or more of the edges of surface 14a. In the example of FIG. 1, touch-sensitive area 12 on front surface 14a extends substantially out to all four edges of front surface 14a. Surface 14a may include room along one or more of its edges for tracking, as described below. Although this disclosure describes and illustrates a particular touch-sensitive area with a particular shape and size on a particular surface of a particular device, this disclosure contemplates any suitable number of any suitable touch-sensitive areas with any suitable shapes and sizes on any suitable number of any suitable surfaces of any suitable device.

As described above, a touch-sensitive area 12 may include a touch sensor that may detect the presence and location of a touch or the proximity of an object within touch-sensitive area 12. The touch sensor may implement a capacitive form of touch sensing. As an example and not by way of limitation, the touch sensor may include an array of drive electrodes and sense electrodes forming capacitive nodes. A change in capacitance at a capacitive node of a touch sensor in a touch-sensitive area 12 may indicate a touch or the proximity of an object at the position of the node in touch-sensitive area 12. In a single-layer configuration, the drive and sense electrodes may be disposed in a pattern on one side of a substrate. In such a configuration, a pair of drive and sense electrodes capacitively coupled to each other across a gap between them may form a capacitive node. As an alternative, in a two-layer configuration, the drive electrodes may be disposed in a pattern on one side of a substrate and the sense electrodes may be disposed in a pattern on another side of the substrate. In such a configuration, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across the substrate at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

The drive and sense electrodes of a touch sensor may be made of fine lines of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and have a thickness of approximately 5 μm or less and a width of approximately 10 μm or less. In particular embodiments, the drive and sense electrodes may be made of indium tin oxide (ITO) in whole or in part in addition or as an alternative to fine lines of metal or other conductive material, where appropriate. Although this disclosure describes particular conductive material for particular electrodes of particular touch sensors, this disclosure contemplates any suitable conductive material for any suitable electrodes of any suitable touch sensors. Moreover, this disclosure contemplates the conductive material having any suitable thickness or width. As described above, drive and sense electrodes may be disposed on a substrate (or on multiple substrates), which may be a dielectric material. One or more portions of the substrate may be made of polyethylene terephthalate (PET) or another suitable material. This disclosure contemplates any suitable number of substrates with any suitable portions made of any suitable material.

A mechanical stack may contain the substrate (or multiple substrates) and the conductive material forming the drive and sense electrodes. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). The first layer of OCA may be disposed between the cover panel and the substrate with the conductive material forming the drive and sense electrodes. The mechanical stack may also include a second layer of OCA and a dielectric layer made, for example, of PET or another suitable material. The second layer of OCA may be disposed between the substrate with the conductive material making up the drive and sense electrodes and the dielectric layer, and the dielectric layer may be disposed between the second layer of OCA and an airgap to a display of device 10. The cover panel may have a thickness of approximately 1 mm; the first layer of OCA may have a thickness of approximately 0.05 mm; the substrate with the conductive material forming the drive and sense electrodes may have a thickness of approximately 0.05 mm (including the conductive material forming the drive and sense electrodes); the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses.

The substrate (or multiple substrates) and the conductive material of the drive and sense electrodes may be flexible, enabling them to wrap around an edge of device 10 from one surface 14 to another. In the example of FIG. 1, the substrate, conductive material of the drive and sense electrodes, and tracking may wrap around (1) the edge between front and left-side surfaces 14a and 14c of device 10; (2) the edge between front and top surfaces 14a and 14e of device 10; (3) the edge between front and right-side surfaces 14a and 14d of device 10; and (4) the edge between front and bottom surfaces 14a and 14f of device 10. This ability to wrap around an edge of device 10 from one surface 14 to another may enable touch-sensitive area 12 on front surface 14a to extend all the way out to that edge, without there being a substantial dead zone along it. As described above, in the example of FIG. 1, touch-sensitive area 12 on front surface 14a of device 10 extends substantially all the way out to at least three edges of front surface 14a, without there being substantial dead zones along those edges. A dead zone on a surface 14 may be an area of surface 14 where there is no deliberate sensing to detect the presence or location of a touch or the proximity of an object.

The substrate (or multiple substrates) may be bonded to one or more flexible printed circuits (FPCs) with one or more controllers. A controller may detect and process the presence and location of a touch or the proximity of an object at a touch sensor in a touch-sensitive area 12. As described above, a change in capacitance at a capacitive node of the touch sensor may indicate a touch or proximity input at the position of the capacitive node in touch-sensitive area 12. A controller may detect and process the change in capacitance to determine the presence and location of the touch or proximity input. The controller may then communicate information about the touch or proximity input to one or more other components (such one or more central processing units (CPUs) or digital signal processors (DSPs)) of device 10, which may respond to the touch or proximity input by initiating a function of device 10 (or an application running on device 10) associated with it. Although this disclosure describes a particular number of controllers having particular functionality with respect to a particular device and a particular touch sensor in a particular touch-sensitive area, this disclosure contemplates any suitable number of any suitable controllers having any suitable functionality with respect to any suitable device and any suitable touch sensor in any suitable touch-sensitive area.

A controller may be one or more integrated circuits (ICs), such as for example general-purpose microprocessors, microcontrollers, programmable logic devices or arrays, application-specific ICs (ASICs). A controller may include a processor unit, a drive unit, a sense unit, and a storage unit. The drive unit may supply drive signals to the drive electrodes of the touch sensor in a touch-sensitive area 12. The sense unit may sense charge at the capacitive nodes of the touch sensor (formed as described above by intersections of drive and sense electrodes or by pairs of drive and sense electrodes capacitively coupled to each other) and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input on a touch sensor in a touch-sensitive area 12. The processor unit may also track changes in the position of a touch or proximity input within touch-sensitive area 12. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular controller having a particular implementation with particular components, this disclosure contemplates any suitable controller having any suitable implementation with any suitable components.

One or more bond pads on an FPC bonded to the substrate (or multiple substrates) may couple a controller on the FPC to corresponding bond pads at the ends of tracks of conductive material extending into or around (e.g. at the edges of) touch-sensitive area 12. The bond pads may be bonded using an anisotropic conductive film (ACF). The tracks may couple the drive and sense electrodes on the substrate to the bond pads on the FPC, in turn connecting them to the controller on the FPC. Particular tracks may provide drive connections coupling the controller to drive electrodes of touch sensors in touch-sensitive area 12, through which the drive unit of the controller may supply drive signals to the drive electrodes. Other tracks may provide sense connections coupling the controller to sense electrodes of touch sensors in touch-sensitive area 12, through which the sense unit of the controller may sense charge at the capacitive nodes of the touch sensors. The tracks may be made of fine lines of metal or other conductive material. As an example and not by way of limitation, one or more portions of the conductive material of the tracks may be copper or copper-based and have a width of approximately 100 µm or less. As another example, one or more portions of the conductive material of the tracks may be silver or silver-based and have a width of approximately 100 µm or less. As another example, in particular embodiments, one or more portions of the conductive material of the tracks may be made of ITO in whole or in part in addition or as an alternative to fine lines of metal or other conductive material, where appropriate. Although this disclosure describes particular tracks made of particular materials with particular widths, this disclosure contemplates any suitable tracks made of any suitable materials with any suitable widths.

Figure 2:
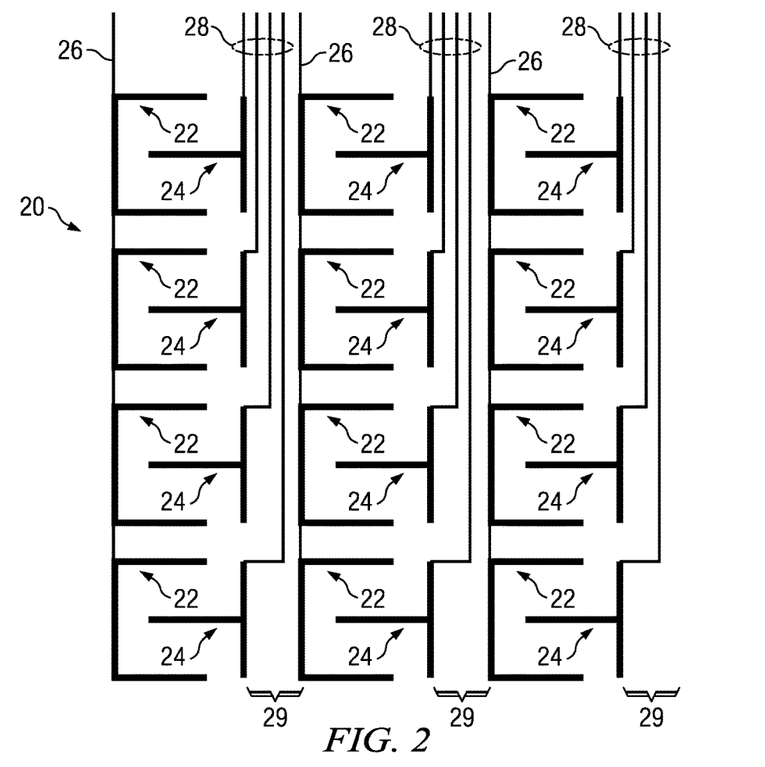
FIG. 2 illustrates example tracking areas for an example substantially edgeless touch-sensitive area.

FIG. 2 (which is not necessarily drawn to scale) illustrates an example pattern of drive and sense electrodes and tracks for an example portion 20 of an example substantially edgeless touch-sensitive area. Portion 20 includes drive and sense electrodes 22 and 24 with tracks 26 and 28 providing drive and sense connections, respectively, to and from them. Tracks 26 and 28 run through tracking areas 29, which run though portion 20 without substantially disrupting the patterns of drive and sense electrodes 22 and 24 in portion 20. In particular embodiments, tracks 26 and 28 may be made of fine lines of metal or other conductive material as described above, and their dimensions may enable drive and sense electrodes 22 and 24 in portion 20 to be close enough together to help avoid the creation of substantial dead zones in portion 20. When tracks 26 and 28 are made of fine lines of metal or other conductive material, tracks 26 and 28 (while not made of transparent material) may because of their dimensions be substantially transparent to a user looking through portion 20. Drive and sense electrodes 22 and 24 may similarly be made of fine lines of metal or other conductive material and their dimensions may enable them to be close enough together in spite of tracking areas 29 to further help avoid the creation of substantial dead zones in portion 20. When drive and sense electrodes 22 and 24 are made of fine lines of metal or other conductive material, drive and sense electrodes 22 and 24 (while not made of transparent material) may because of their dimensions be substantially transparent to a user looking through portion 20. In particular embodiments, one or more portions of drive and sense electrodes 22 and 24, tracks 26 and 28, or both may be made of ITO in whole or in part in addition or as an alternative to fine lines of metal or other conductive material, where appropriate. In addition, tracks 26 and 28 may be made of silver or a similar material when they extend outside of a visible area of the touch sensor through which a display underlying the touch sensor may be visible to a user. Although this disclosure describes and illustrates a particular pattern of particular drive and sense electrodes and tracks for a particular portion of a particular substantially edgeless touch-sensitive area, this disclosure contemplates any suitable pattern of any suitable drive and sense electrodes and tracks for any suitable portion of any suitable substantially edgeless touch-sensitive area.

Figure 3:
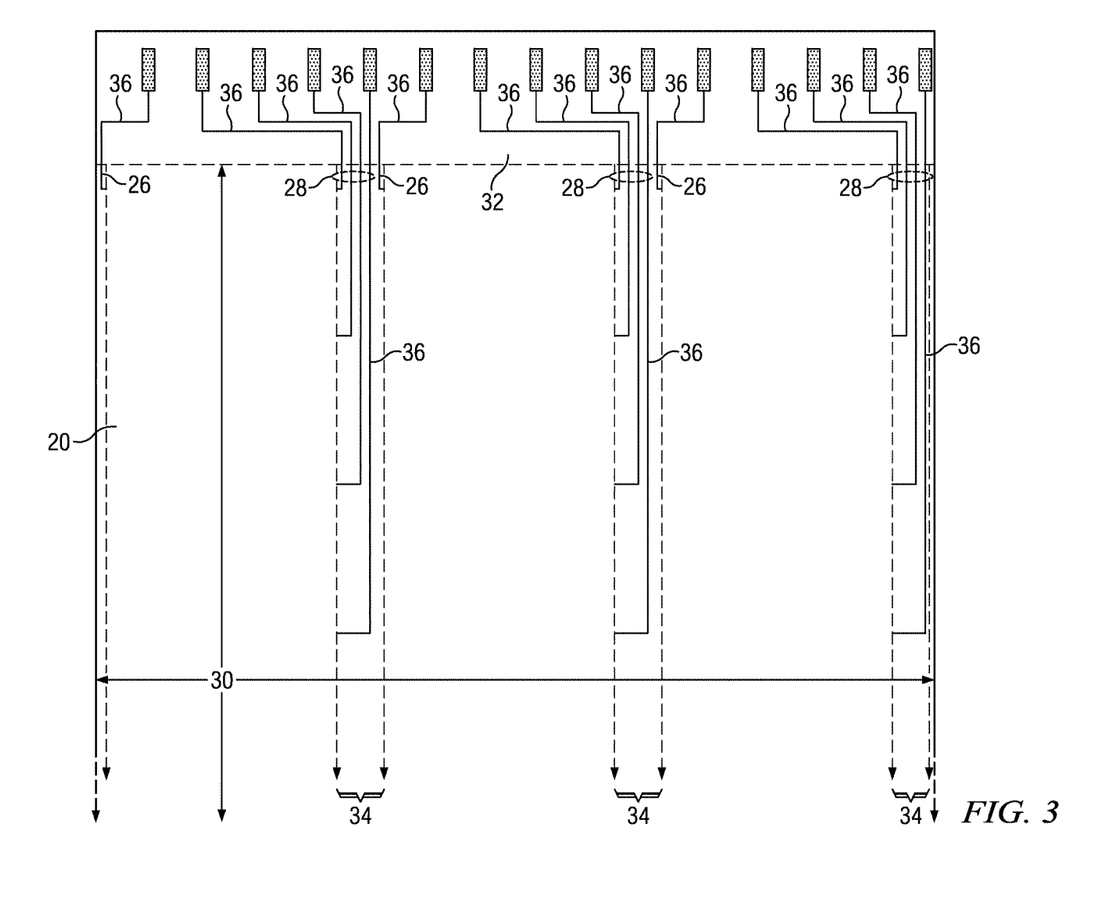
FIG. 3 illustrates another example arrangement of tracks for an example substantially edgeless touch-sensitive area.

FIG. 3 (which is not necessarily drawn to scale) illustrates example tracking areas for an example substantially edgeless touch-sensitive area 30. A tracking area may include tracks providing drive and sense connections to and from the drive and sense electrodes of touch sensors in a touch-sensitive area. FIG. 3 illustrates two example tracking areas 32 and 34. One or more portions of touch-sensitive area 30 of FIG. 3 may be similar to portion 20 of FIG. 2. As an example and not by way of limitation, tracking area 34 in FIG. 3 may be similar in one or more respects to tracking area 29 in FIG. 2. As another example, drive and sense electrodes in touch-sensitive area 30 of FIG. 3 may be similar in one or more respects to drive and sense electrodes 22 and 24 in portion 20 of FIG. 2. In the example of FIG. 3, touch-sensitive area 30 may extend substantially all the way out to three of the edges of the surface it occupies (e.g. the top, right, and left edges), with there being a tracking area 32 creating a dead zone along one of the edges of the surface (e.g. the bottom edge). As an alternative, in particular embodiments, touch-sensitive area 30 may extend substantially all the way out to all four edges of the surface that it occupies, with tracking area 32 being narrow enough along the edge of the surface that it occupies (e.g. the bottom edge) to avoid creating a substantial dead zone along that edge. In addition or as another alternative, touch-sensitive area 30 may extend substantially all the way out to all four edges of the surface that it occupies, with the substrate (or multiple substrates) of touch-sensitive area 30 and tracking area 32 (and the conductive material of the drive and sense electrodes and tracks disposed on them) wrapping around an edge of the surface (e.g. the bottom edge) so that tracking area 32 occupies another surface on the other side of that edge (e.g. a bottom surface) and does not create a substantial dead zone on the surface that touch-sensitive area 30 occupies (e.g. a front surface). Example tracks in tracking area 32 are illustrated in FIG. 3 as tracks 36, each with a bond pad at one end for connection to a corresponding bond pad on an FPC bonded to the substrate containing the drive and sense electrodes and tracks for touch-sensitive area 30.

Tracking area 34 may extend into touch-sensitive area 30 without substantially disrupting the patterns of drive and sense electrodes anywhere in touch-sensitive area 30. The drive and sense electrodes for touch-sensitive area 30 may be made of fine lines of metal or other conductive material. The tracks providing the drive and sense connections to and from the drive and sense electrodes may also be made of fine lines of metal or other conductive material. The tracks may be made of the same material as the drive and sense electrodes. The drive and sense electrodes for touch-sensitive area 30, the tracks in tracking areas 32 or 34, or both may be made of indium tin oxide (ITO) in whole or in part in addition or as an alternative to fine lines of metal or other conductive material. In particular embodiments, the narrowness of the lines forming the drive and sense electrodes may leave space in touch-sensitive area 30 for the tracks to extend into (as in the case of tracking area 34) or along the edges (as in the case of tracking area 32) of touch-sensitive area 30 without substantially disrupting the patterns of drive electrodes and sense electrodes anywhere in touch-sensitive area 30. As a result, the tracks may extend into or along the edges of touch-sensitive area 30 without creating substantial dead zones in or along touch-sensitive area 30. In addition or as an alternative, the narrowness of the lines forming the tracks may enable them to extend into or along the edges of touch-sensitive area 30 without substantially disrupting the patterns of drive electrodes and sense electrodes anywhere in touch-sensitive area 30. Although this disclosure describes and illustrates a particular number of particular tracking areas, this disclosure contemplates any suitable number of any suitable tracking areas. As an example, multiple tracking areas (instead of tracking area 34 alone) may extend into touch-sensitive area 30 without substantially disrupting the patterns of drive electrodes and sense electrodes in touch-sensitive area 30.

Figure 4:
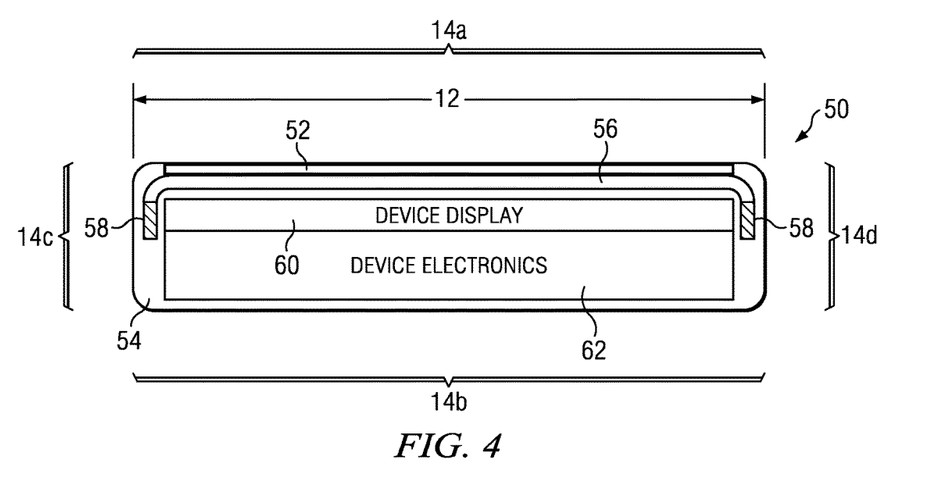
FIG. 4 illustrates an example cross section of an example device with an example substantially edgeless touch-sensitive area.

FIG. 4 illustrates an example cross section of an example device 50 with an example substantially edgeless touch-sensitive area 12. Device 50 includes a cover panel 52, device housing 54, substrate 56 (with tracking areas 58), device display 60, and device electronics 62. Device 50 has touch-sensitive areas 12 on its front surface 14a. Touch-sensitive area 12 on front surface 14a of device 50 extends out to the left and right edges of front surface 14a of device 50.

Substrate 56 may have drive and sense electrodes disposed on it, and substrate 56 and the conductive material of the drive and sense electrodes may be flexible, enabling them to wrap around the left and right edges of front surface 14a to left-side and right-side surfaces 14c and 14d. For sharper edges (e.g. with radiuses of less than 1 mm), the flexible conductive material of the drive and sense electrodes may be thicker or wider at the sharper edges than at the flat portions of surfaces 14a, 14c, and 14d. Substrate 56 may include or have attached to it tracking areas 58, which may include tracks providing drive and sense connections to and from the drive and sense electrodes of touch sensors in touch-sensitive areas 12 of device 50.

Device display 60 may be a liquid crystal display (LCD), a light-emitting diode (LED) display, an LED-backlight LCD, or other suitable display and may be visible though cover panel 52 and substrate 56 (and the drive and sense electrodes disposed on it). Although this disclosure describes and illustrates a particular device display and particular display types, this disclosure contemplates any suitable device display and any suitable display types. Device electronics 62 may provide the functionality of device 50. As example and not by way of limitation, device electronics 62 may include circuitry or other electronics for wireless communication to or from device 50, running applications on device 50, generating graphical or other user interfaces (UIs) for device display 60 to display to a user, managing power to device 50 from a battery or other power source, taking still pictures, recording video, other suitable functionality, or a suitable combination of these. Although this disclosure describes and illustrates particular device electronics providing particular functionality of a particular device, this disclosure contemplates any suitable device electronics providing any suitable functionality of any suitable device.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. § 101. Herein, reference to a computer-readable storage medium excludes transitory forms of signal transmission (such as a propagating electrical or electromagnetic signal per se) to the extent that they are not eligible for patent protection under 35 U.S.C. § 101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
   a substrate configured to extend substantially out to at least four edges of a first surface of a device, the substrate further configured to wrap around at least a first edge and a second edge of the at least four edges of the first surface of the device;
   a touch sensor disposed on the substrate, the touch sensor comprising:
      an active area that is configured to extend substantially out to the at least four edges of the first surface of the device; and
      a plurality of electrodes comprising a first plurality of electrodes configurable to operate as drive electrodes and a second plurality of electrodes configurable to operate as sense electrodes, the first plurality of electrodes having a U shape and being arranged in a first plurality of columns, the second plurality of electrodes having a T shape and being arranged in the first plurality of columns, each of the first plurality of electrodes and each of the second plurality of electrodes forming a plurality of capacitive nodes at respective positions in which one of the first plurality electrodes having the U shape is interdigitated with one of the second plurality of electrodes having the T shape; and
   a plurality of bond pads located at a second surface of the device, the second surface facing a different direction than the first surface and corresponding to the portions of the substrate wrapping around the first edge of the at least four edges of the first surface of the device, each of the plurality of bond pads configured to couple to a corresponding bond pad on one or more flexible printed circuits (FPCs);
   wherein:
      the substrate comprises a plurality of tracking areas where tracks providing connections to and from the plurality of electrodes of the touch sensor are disposed on the substrate, the tracks of the plurality of tracking areas extending to the first edge of the first surface of the device and wrapping around the first edge onto the second surface of the device to provide respective connections to and from control circuitry, the tracks including a respective track in each of the plurality of columns providing a connection to all of the first plurality of electrodes arranged in respective column of the plurality of columns; and at least one of the plurality of tracking areas is configured to extend into the active area of the touch sensor in a gap formed between at least two adjacent columns of the plurality of columns such that multiple tracks, each providing a connection to a corresponding electrode of the second plurality of electrodes in a column, of the at least one tracking area are positioned, in plan view, in the gap formed between the at least two adjacent columns of the plurality of columns, the multiple tracks being substantially parallel in the gap along at least a portion of respective lengths of the multiple tracks, the multiple tracks of the at least one of the plurality of tracking areas configured to wrap around, with the substrate, the first edge of the first surface of the device onto the second surface of the device to provide the respective connections to or from the control circuitry, each of the multiple tracks extending in a first direction from the gap to the first edge, each of the multiple tracks configured to respectively couple to each of the plurality of bond pads at the second surface of the device, the at least two adjacent columns of the plurality of columns being adjacent in that an electrode of the first plurality of electrodes or the second plurality of electrodes is not positioned in the gap between the at least two adjacent columns of the plurality of columns.

2. The apparatus of claim 1, wherein:
the substrate is further configured to wrap around a third edge of the at least four edges of the first surface of the device; and
the touch sensor is configured to wrap around the first, second, and third edges of the first surface of the device with the substrate, the wrapping of the touch sensor around the first, second, and third edges at least in part enabling the active area of the touch sensor to extend substantially out to the first, second, and third edges of the first surface of the device.

3. The apparatus of claim 2, wherein one or more portions of one or more of the plurality of tracking areas are configured to be located on a third surface of the device on a side of the third edge of the device around which the substrate is configured to wrap.

4. The apparatus of claim 1, wherein the first surface of the device is flat or curved.

5. The apparatus of claim 1, wherein the touch sensor comprises:
a single-layer configuration with the first plurality of electrodes and second plurality of electrodes disposed only on one side of a single substrate;
a single-layer configuration with the first plurality of electrodes disposed on a first side of a single substrate and the second plurality of electrodes disposed on a second side of the single substrate opposite the first side; or
a two-layer configuration with the first plurality of electrodes disposed on one side of a first substrate and the second plurality of electrodes disposed on one side of a second substrate.

6. The apparatus of claim 1, wherein the touch sensor is a mutual-capacitance touch sensor or a self-capacitance touch sensor.

7. The apparatus of claim 1, wherein the plurality of electrodes comprises electrodes each made of substantially flexible conductive material comprising a conductive mesh of conductive metal lines.

8. The apparatus of claim 1, wherein one or more portions of one or more of the tracks are made of conductive material comprising a conductive mesh of conductive metal lines.

9. The apparatus of claim 1, wherein one or more of the plurality of electrodes are made of indium tin oxide (ITO).

10. The apparatus of claim 1, wherein one or more portions of one or more of the tracks are made of indium tin oxide (ITO).

11. The apparatus of claim 1, wherein the tracks are made of fine lines of metal and have a width of approximately 100 µm or less.

12. A device comprising:
a substrate configured to extend substantially out to at least two edges of a first surface of a device, the substrate further configured to wrap around at least a first edge and a second edge of the at least two edges of the first surface of the device;
a touch sensor disposed on the substrate, the touch sensor comprising an active area that is configured to extend substantially out to the at least two of the edges of the first surface of the device;
a plurality of bond pads located at a second surface of the device, the second surface facing a different direction than the first surface and corresponding to portions of the substrate wrapping around the first edge of the at least four edges of the first surface of the device, each of the plurality of bond pads configured to couple to a corresponding bond pad on one or more flexible printed circuits (FPCs); and
one or more computer-readable non-transitory storage media embodying logic that is configured when executed to control the touch sensor;
wherein:
the substrate comprises one or more tracking areas where tracks providing drive or sense connections to or from drive or sense electrodes of the touch sensor are disposed on the substrate, the drive electrodes having a U shaped and being arranged in columns, the sense electrodes having a T shaped and being arranged in the columns, each of the drive electrodes and each of the sense electrodes forming capacitive nodes at respective positions in which one of the drive electrodes having the U shaped is interdigitated with one of the sense electrodes having a T shaped, the tracks including a respective track in each of the columns providing a connection to all of the drive electrodes arranged in a respective column of the columns; and
at least one of the one or more tracking areas is configured to extend into the active area of the touch sensor in a gap formed between two of the columns such that multiple tracks, each providing a connection to a corresponding sense electrode, of the tracking area are positioned, in plan view, in the gap formed between the two columns, the multiple tracks being substantially parallel in the gap along at least a portion of respective lengths of the multiple tracks, the multiple tracks of the at least one of the one or more tracking areas configured to wrap around, with the substrate, the first edge of the first surface of the device onto the second surface of the device to provide respective connections to or from control circuitry, each of the multiple tracks extending in a first direction from the gap to the first edge, each of the multiple tracks configured to respectively couple to each of the plurality of bond pads at the second surface of the device, the two columns being adjacent in that neither a drive electrode nor a sense electrode is positioned in the gap between the two columns.

13. The device of claim 12, wherein:
the substrate is further configured to wrap around a third edge of the at least two edges of the first surface of the device; and
the touch sensor is configured to wrap around the first, second, and third edges of the at least two edges of the first surface of the device with the substrate, the wrapping of the touch sensor around the first, second, and third edges of the at least two edges at least in part enabling the active area of the touch sensor to extend substantially out to the first, second, and third edges of the at least two edges of the first surface of the device.

14. The device of claim 13, wherein one or more portions of the one or more tracking areas are configured to be located on a third surface of the device on a side of the third edge of the device that the substrate is configured to wrap around.

15. The device of claim 12, wherein the first surface of the device is flat or curved.

16. The device of claim 12, wherein the touch sensor comprises:
a single-layer configuration with drive and sense electrodes disposed only on one side of a single substrate;
a single-layer configuration with drive electrodes disposed on a first side of a single substrate and sense electrodes disposed on a second side of the single substrate opposite the first side; or
a two-layer configuration with drive electrodes disposed on one side of a first substrate-and sense electrodes disposed on one side of a second substrate.

17. The device of claim 12, wherein the touch sensor is a mutual-capacitance touch sensor or a self-capacitance touch sensor.

18. The device of claim 12, wherein the touch sensor comprises drive or sense electrodes made of substantially flexible conductive material comprising a conductive mesh.

19. The device of claim 12, wherein one or more portions of one or more of the tracks disposed on the substrate providing drive or sense connections to or from drive or sense electrodes of the touch sensor are made of conductive material comprising a conductive mesh of conductive metal lines.

20. The device of claim 12, wherein one or more portions of one or more of the tracks disposed on the substrate providing drive or sense connections to or from drive or sense electrodes of the touch sensor are located outside a visible area of the touch sensor and are made of conductive material.

21. The device of claim 12, wherein the touch sensor comprises drive or sense electrodes made of indium tin oxide (ITO).

22. The device of claim 12, wherein one or more portions of one or more of the tracks disposed on the substrate providing drive or sense connections to or from drive or sense electrodes of the touch sensor are made of indium tin oxide (ITO).

* * * * *